(12) United States Patent
Bernier et al.

(10) Patent No.: US 6,492,071 B1
(45) Date of Patent: Dec. 10, 2002

(54) WAFER SCALE ENCAPSULATION FOR INTEGRATED FLIP CHIP AND SURFACE MOUNT TECHNOLOGY ASSEMBLY

(75) Inventors: William E. Bernier, Endwell, NY (US); Mark V. Pierson, Binghamton, NY (US); Ajit K. Trivedi, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 105 days.

(21) Appl. No.: 09/670,410

(22) Filed: Sep. 26, 2000

(51) Int. Cl.[7] .............................. G03F 9/00; G03C 5/00; H01L 21/44
(52) U.S. Cl. .................. 430/5; 430/308; 438/106; 438/108; 438/112; 438/114
(58) Field of Search .................... 430/5, 308; 438/106, 438/108, 112, 114

(56) References Cited

U.S. PATENT DOCUMENTS

| | | | |
|---|---|---|---|
| 5,430,325 A | 7/1995 | Sawada et al. ............. 257/618 |
| 5,668,059 A | 9/1997 | Christie et al. ............. 438/118 |
| 5,759,737 A | * 6/1998 | Feilchenfeld et al. ....... 430/311 |
| 5,831,330 A | 11/1998 | Chang ........................ 257/620 |
| 5,891,808 A | 4/1999 | Chang et al. ............... 438/740 |
| 6,213,386 B1 | * 4/2001 | Inoue et al. ................ 228/245 |
| 6,303,407 B1 | * 10/2001 | Hotchkiss et al. .......... 438/106 |
| 6,323,062 B1 | * 11/2001 | Gilleo et al. ................ 438/114 |

FOREIGN PATENT DOCUMENTS

| JP | 2-122659 | 5/1990 |
|---|---|---|
| JP | 6-163615 | 6/1994 |

* cited by examiner

*Primary Examiner*—Mark F. Huff
*Assistant Examiner*—Saleha R. Mohamedulla
(74) *Attorney, Agent, or Firm*—Connolly Bove Lodge & Hutz, LLP; Lawrence R. Fraley, Esq.

(57) ABSTRACT

A device and process for applying mixtures of adhesive formulations combined with solder flux such that flip chips may be rapidly encapsulated with such combinations without interfering with subsequent wafer processing steps are provided. Also provided is a wafer stencil designed in such a manner that the saw kerf lines separating individual chip dies are protected from coming into contact with the formulation. Extrusion screening using such wafer stencil is also provided.

19 Claims, 2 Drawing Sheets

WAFER SCALE ENCAPSULATION FOR INTEGRATED FLIP CHIP AND SURFACE MOUNT TECHNOLOGY ASSEMBLY

DESCRIPTION

1. Technical Field

The present invention is concerned with so-called "controlled collapse chip connection" or C4 semiconductor devices that employ solder bump interconnections, also known as flip chip or face down bonding. Specifically, the present invention relates to assembling, such devices, together with surface mount technology (SMT) devices, on a single carrier surface while allowing convenient dicing, subsequent processing, and preparation for surface mount assembly on cards and boards.

2. Background of Invention

Controlled collapse chip connection technology has been successfully used for decades to interconnect high input/ouput (I/O) count and area array solder bumps on integrated circuit chips to the base ceramic e.g. alumina, carriers. See U.S. Pat. No. 5,668,059 to Christie et al. and assigned to the assignee of the present patent application, disclosure of which is incorporated herein by reference, for further discussion of the C4 interconnection technology.

The rapidly increasing sophistication of integrated circuit devices has resulted in greatly increased chip sizes, but of even more significance, in explosively larger numbers of I/O terminals that must be solder connected. The advantage of solder joining is that the I/O terminals may be distributed over substantially the entire top surface of the semiconductor device. This efficient use of the entire surface area is known as area array bonding The usual practice involves mounting the integrated circuit semiconductor device, normally formed of monocrystalline silicon having a coefficient of thermal expansion 2.5×10–6 per ° C., on a substrate, either alumina (5.8×10–6 per ° C.) or a rigid or flexible organic material (coefficient of thermal expansion ranging from 6×10–6 per ° C. to 24×10–6 per ° C.). The active and passive circuit elements generate heat that is conducted through the electrical connections. As a result the devices and their carriers expand and contract differentially imposing stresses on the relatively rigid solder joints. The stress on the solder joints is inversely proportional to the height of the solder bump, but the larger the number of I/O terminals incorporated into the device, the smaller the individual solder bumps become.

To provide mechanical stability and electrical isolation, Beckham et al. disclose in U.S. Pat. No. 4,604,644 (assigned to assignee of present invention and disclosure of which is hereby incorporated by reference) an improved solder interconnection structure with increased fatigue life. In particular their method for electrically joining a semiconductor device to a support substrate that has a plurality of solder connections incorporates a dielectric, organic material disposed between the semiconductor device and the supporting substrate to provide both electrical isolation and mechanical stability.

U.S. Pat. No. 5,668,059 to Christie et al. and assigned to the assignee of the present application, disclosure of which is hereby incorporated by reference, discloses an improved organic encapsulating adhesive formulation.

During the process of manufacturing semiconductor devices a plurality of dies, each containing an integrated circuit, are fabricated on a semiconductor wafer. Saw kerf lines are provided between adjacent dies such that the wafer may be sliced with a diamond saw into individual chips. Subsequent to the slicing operation, each individual chip is provided with an array of solder bumps to facilitate electrical connection With the chip carrier to which it will ultimately be mated. And in separate steps. the individual chips are coated with an adhesive formulation to provide stable, mechanical bonding between the chip and its carrier and a flux application is made to enable flow of the solder bumps during subsequent heating steps. The individual encapsulated chips are packaged to await placement on camers.

Mixtutes of adhesive and flux which can be applied to chips in a single step are now in development at Dexter Corporation, Windsor Locks, CT. Clearly, great reductions in processing time could be realized if such flux-adhesive formulation could be applied to the plurality of dies in a single step instead of having to be applied to individual chips. However, currently, a disadvantage of attempting such wafer-scale application is that the flux-adhesive formulations aggregate to and disable the diamond saw used to slice the wafer.

SUMMARY OF INVENTION

The present invention addresses problems encountered in attempting to apply adhesive and flux compositions to a plurality of dies at the same time. The present invention relates to a device and process for applying mixtures of such formulations combined with solder flux such that flip chips may be rapidly encapsulated with such combinations without interfering with subsequent wafer processing steps.

The present invention provides a method by which the flux-adhesive formulation is screened onto the wafer using a stencil designed in such a manner that the saw kerf lines separating individual chip dies are protected from coming into contact with the formulation. Moreover, the invention provides a means of forming a dam about the peripheral area of the wafer, thus preventing the formulation from contaminating the edge of the wafer or from escaping from the surface of the wafer. The present invention also permits greater production throughput by permitting the application of combined flux-adhesive formulations, in a single step, to a plurality of chips, rather than requiring a separate step for each chip.

The present invention provides a means by which both flip-chip and SMT devices may be placed on a single surface of a carrier and reflowed in a single step.

In particular, the present invention is concerned with a screening mask for screening of a formulation for mounting a combination of flip chip and SMT devices on a carrier comprising peripheral members;

a lattice of kerf protecting members disposed to cover the saw kerf area of the corresponding semiconductor chip and connected to the peripheral members, membrane of mask material 25 interconnecting the lattice of kerf protecting members, the membrane having a pattern of openings.

Another aspect of the present invention is concerned with a method of using a screening head above the disclosed screening mask. The method comprises aligning the screening mask over a semiconductor wafer;

aligning an extrusion head over the screening mask with wiping blades contacting the screening mask;

extruding an encapsulant flux mixture; and traversing the extrusion head thereby removing excess encapsulant flux mixture.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

SUMMARY OF DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DESCRIPTION OF THE INVENTION

Figure 1:
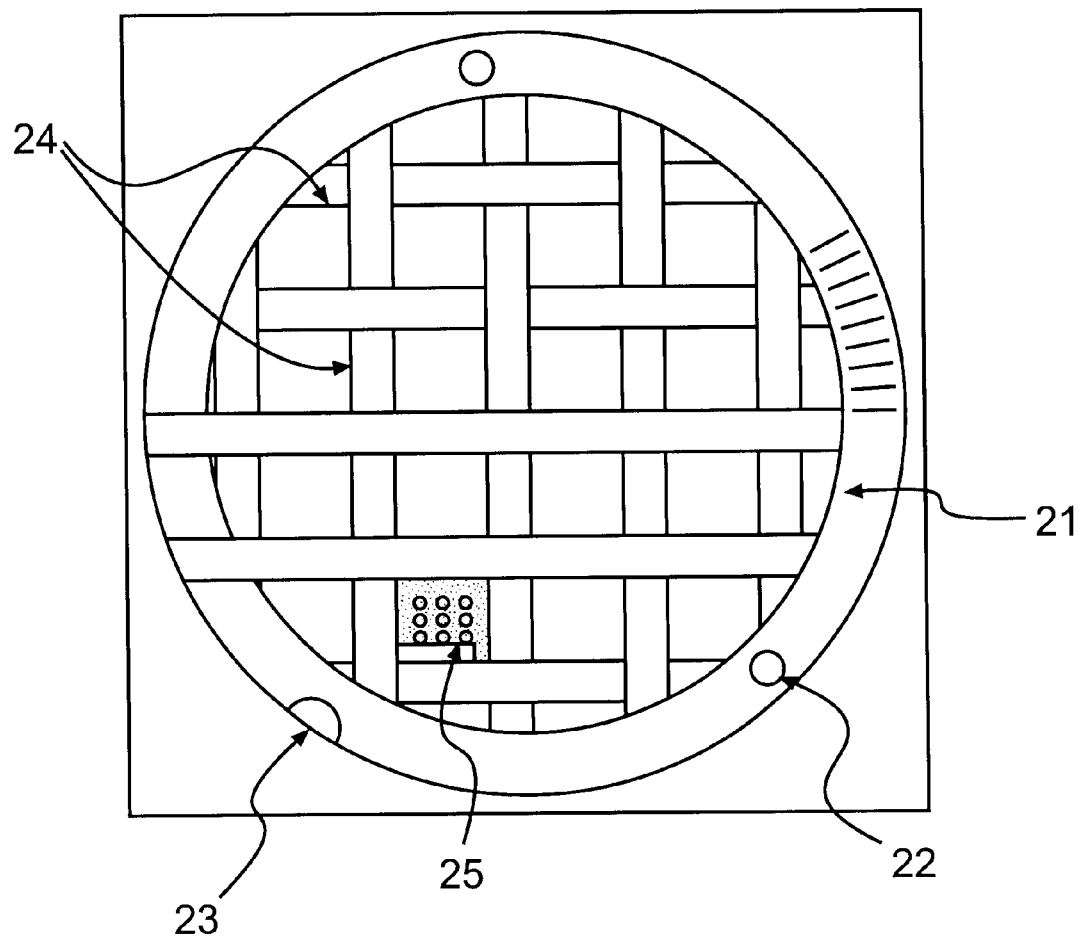
FIG. 1 is a top view of a wafer mask according to the present invention
Figure 2:
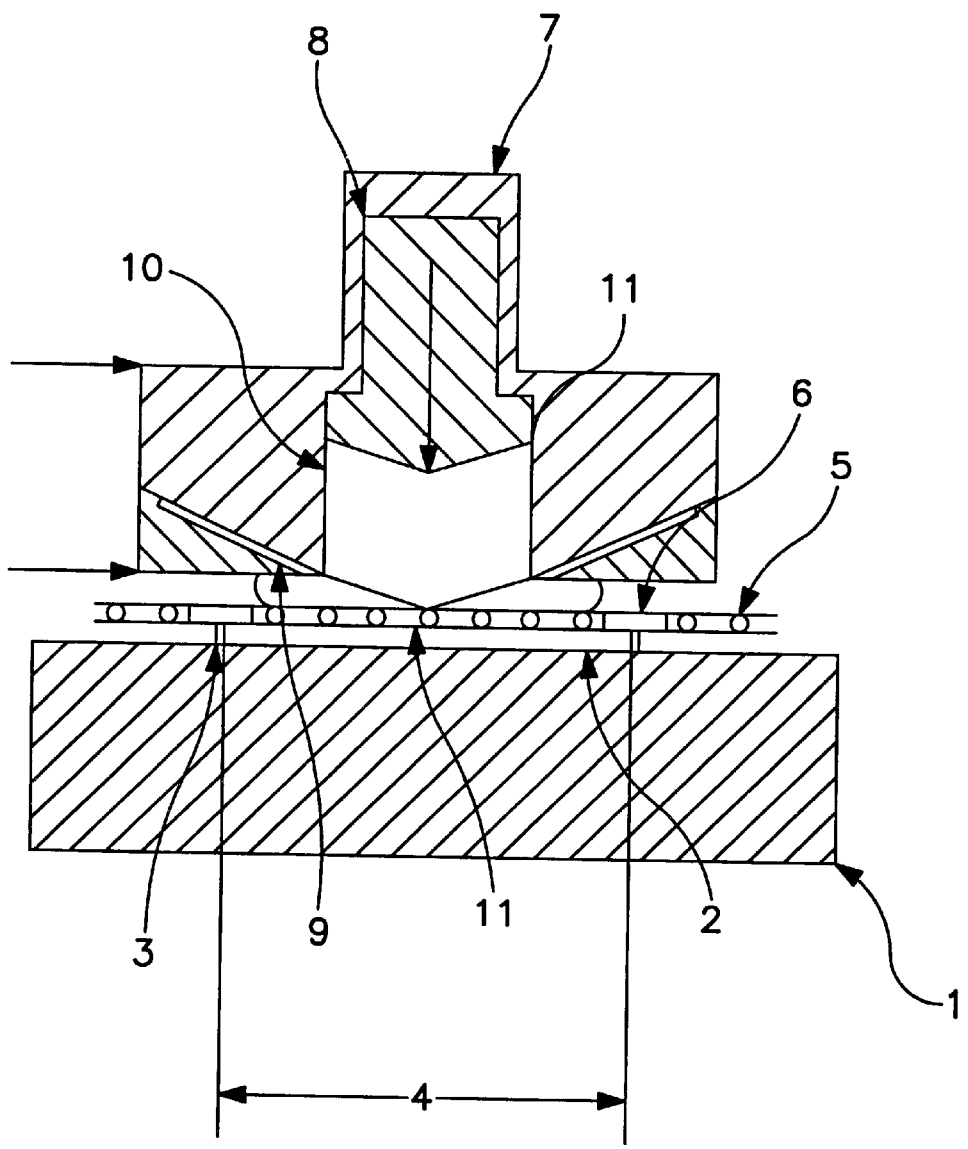
FIG. 2 is a side view of a Wafer on a flat plate.

Reference is made to the figures to illustrate selected embodiments and preferred modes of carrying out the invention. It is to be understood that the invention is not hereby limited to those aspects depicted in the figures.

The wafer stencil provides a means for confining applications of flux-adhesive formulations to designated areas of a semiconductor wafer. The invention provides a means of regulating the amount of such formulations retained on the wafer. This means is accomplished by regulating the thickness of the various members in contact with wiper blades attached to the formulation extrusion head.

The wafer stencil, or mask, is typically made from stainless steel, in other embodiments nickel is used in the alternative. Its exterior dimensions are substantially those of the wafer for which it serves as a mask. The mask has thick substantially toroidal peripheral member(s)(21) corresponding in size and shape to the perimeter of the wafer to be processed. The thickness of the peripheral member is from about 0.002 inches to about 0.008 inches and is typically equal to the height of the solder bumps applied to the chip dies, but, in some embodiments, may be of greater thickness. The stencils have fiducials (22),(23) to permit alignment of the stencil to the wafer by standard stencil screening apparatus.

Connected to the peripheral member is a lattice of kerf protecting members (24). In some embodiments, the kerf protecting members are formed of the same material as the peripheral members, but in some embodiments other metals such as brass and molybdenum are used. The kerf members are disposed such that they lie above and substantially parallel to the corresponding kerf lines of the wafer to be processed. The height of the kerf protecting members is typically substantially equal to that of the peripheral members. The width of the kerf protecting members must be at least equal to the width of the saw used to slice the wafer. In some embodiments greater widths may be employed, typically the width is from about 0.005 inches to about 0.010 inches.

Disposed between the kerf protecting members is an opening corresponding in size and position to the solder bumps (5) of the corresponding chips.

The thickness of the applied film of flux-adhesive formulation is controlled to provide acceptable underfill flow and fillet formation. These desired characteristics are in turn, governed by the properties of the flux-adhesive formulation during subsequent heating steps. The flux-adhesive formulation is a thermoset type. If rework is needed, the formulation may be a re-workable flux system. Such systems permit removal and replacement of flip-chip devices requiring underfill.

The method of using the stencil involves aligning the wafer (2), held on a flat plate (1), and stencil (6) relative to each other using tooling pins and cognate holes in the stencil and wafer. Lowering the encapsulation head (7) until the squeegee blades (9) contact the stencil. In the typical embodiment, an IBM proprietary design encapsulation head is used. An air-driven piston (8) forces flux—encapsulating formulation mix (10) through a narrow slit between the two squeegee blades (11). The head moves laterally dispensing encapsulant on the wafer. The kerf protecting members prevent encapsulant from violating the edge of the chip (3) thus subsequent dicing steps slice the wafer into individual chips (4) without loading the saw blade with adhesive. The peripheral members prevent formulation from escaping from the surface of the wafer and contaminating the processing area or machinery.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also it is intended that the appended claims be construed to include alternative embodiments.

What is claimed is:

1. A screening mask comprising
   peripheral members;
   a lattice of kerf protecting members disposed to cover the saw kerf area of a corresponding semiconductor wafer and connected to the peripheral members;
   a membrane of mask material interconnecting the lattice of kerf protecting members, the membrane having a pattern of openings.

2. A screening mask, according to claim 1, wherein the height of the peripheral members and the kerf protecting members is equal to the height of chip interconnection bumps.

3. A screening mask, according to claim 1, wherein the height of the peripheral members and the kerf protecting members is greater than the height of chip interconnection bumps.

4. A screening mask, according to claim 1, wherein the pattern of openings corresponds to a pattern of solder bumps on chip to be attached.

5. A screening mask, according to claim 1, wherein the diameter of the opening, corresponds to the diameter of solder bumps on chip to be attached.

6. A method of extrusion screening comprising providing a mask comprising peripheral members;

a lattice of kerf protecting members disposed to cover the saw kerf area of a corresponding semiconductor wafer and connected to the peripheral members;

a membrane of mask material interconnecting the lattice of kerf protecting members, the membrane having a pattern of openings;

aligning said mask over a semiconductor wafer;

aligning an extrusion head over the mask with wiping blades contacting the mask;

extruding an encapsulant flux mixture; and traversing the extrusion head thereby removing excess encapsulant mixture.

7. A method of extrusion screening, according to claim 6, wherein the encapsulant mixture comprises a reworkable encapsulant flux-adhesive system.

8. A method of extrusion screening, according to claim 6, wherein the encapsulant mixture comprises a thermoset flux-adhesive system.

9. A method of extrusion screening, according to claim 6, wherein the encapsulant mixture comprises a thermoplastic flux-adhesive system.

10. A method of extrusion screening, according to claim 6, wherein the wafer is aligned substantially at right angles to the extrusion head.

11. A method of extrusion screening, according to claim 6, wherein the wafer is aligned substantially at 90° to the extrusion head.

12. A method of extrusion screening, according to claim 6, wherein the wafer is aligned substantially not at right angles to the extrusion head.

13. A screening mask for extrusion screening of combined solder flux and adhesive formulation for mounting a mix of flip chip and SMT devices on a carrier comprising peripheral members;

a lattice of kerf protecting members disposed to cover the saw kerf area of a corresponding semiconductor wafer and connected to the peripheral members;

a membrane of mask material interconnecting the lattice of kerf protecting members, the membrane having a pattern of openings;

means for preventing encapsulant from contacting the perimeter area of a wafer;

means for preventing encapsulant from contacting the saw kerf area of the wafer.

14. A method of extrusion screening, using a screening mask according to claim 13, comprising aligning said screening mask over a semiconductor wafer;

aligning an extrusion head over said mask with wiping blades contacting the mask;

extruding an encapsulant flux mixture; and traversing the extrusion head thereby removing excess encapsulant mixture.

15. A method of extrusion screening, according to claim 14, wherein the encapsulant mixture comprises a reworkable encapsulant flux-adhesive system.

16. A method of extrusion screening, according to claim 14, wherein the encapsulant mixture comprises a thermoset flux-adhesive system.

17. A method of extrusion screening, according to claim 14, wherein the wafer is aligned substantially at right angles to the extrusion head.

18. A method of extrusion screening, according to claim 14, wherein the wafer is aligned substantially at 90° to the extrusion head.

19. A method of extrusion screening, according to claim 14, wherein the wafer is aligned substantially not at right angles to the extrusion head.

\* \* \* \* \*